(12) United States Patent
Otsuka et al.

(10) Patent No.: US 7,400,000 B2
(45) Date of Patent: *Jul. 15, 2008

(54) NITRIDE-BASED SEMICONDUCTOR DEVICE

(75) Inventors: Koji Otsuka, Niiza (JP); Junji Sato, Niiza (JP); Tetsuji Moku, Niiza (JP); Yoshiki Tada, Niiza (JP); Takashi Yoshida, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 219 days.

This patent is subject to a terminal disclaimer.

(21) Appl. No.: 11/294,510

(22) Filed: Dec. 5, 2005

(65) Prior Publication Data

US 2006/0094145 A1    May 4, 2006

Related U.S. Application Data

(63) Continuation of application No. PCT/JP2004/007849, filed on May 31, 2004.

(30) Foreign Application Priority Data

Jun. 6, 2003   (JP) .............................. 2003-162394
Mar. 26, 2004   (JP) .............................. 2004-093516

(51) Int. Cl.
   *H01L 31/0328* (2006.01)
(52) U.S. Cl. .................. 257/189; 257/96; 257/103; 257/190; 257/E21.127
(58) Field of Classification Search .................. 257/103, 257/96, 183, 200, 242, 262
See application file for complete search history.

(56) References Cited

U.S. PATENT DOCUMENTS 5,679,965 A * 10/1997 Schetzina .................... 257/103
6,664,560 B2 * 12/2003 Emerson et al. ................ 257/14
2001/0052601 A1 * 12/2001 Onishi et al. ................. 257/138
2003/0020061 A1 * 1/2003 Emerson et al. ................ 257/14

FOREIGN PATENT DOCUMENTS

| JP | 09-162125 | 6/1997 |
| JP | 2000-004047 | 1/2000 |
| JP | 2002-208729 | 7/2002 |
| JP | 2003-046112 | 2/2003 |
| JP | 2003-059948 | 2/2003 |

OTHER PUBLICATIONS

Marchand, H. et al., "Metalorganic Chemical Vapor Deposition of GaN on Si(111):Stress Control and Application to Field-Effect Transistors", *journal of Applied Physics*, Jun. 15, 2001, 89(12), 7846-7851.
Wu, Wang-C. et al., "Effect of Rapid Thermal Annealing on Radio-Frequency Magnetron-Sputtered GaN Thin Films and Au/GaN Schottky Diodes", *J. Vac. Sci. Technol. B*, Jul./Aug. 1999, 17(4), 1545-1548.

* cited by examiner

*Primary Examiner*—Dung A. Le
(74) *Attorney, Agent, or Firm*—Woodcock Washburn LLP

(57) ABSTRACT

A light-emitting diode is built on a silicon substrate doped with a p-type impurity to possess sufficient conductivity to provide a current path. The p-type silicon substrate has epitaxially grown thereon two superposed buffer layers of aluminum nitride and n-type indium gallium nitride. Further grown epitaxially on the buffer layers is the main semiconductor region of the LED which comprises a lower confining layer of n-type gallium nitride, an active layer for generating light, and an upper confining layer of p-type gallium nitride. In the course of the growth of the main semiconductor region there occurs a thermal diffusion of aluminum, gallium and indium from the buffer layers into the p-type silicon substrate, with the consequent creation of an alloy layer of the diffused metals. Representing p-type impurities in the p-type silicon substrate, these metals do not create a pn junction in the substrate which causes a forward voltage drop.

15 Claims, 5 Drawing Sheets

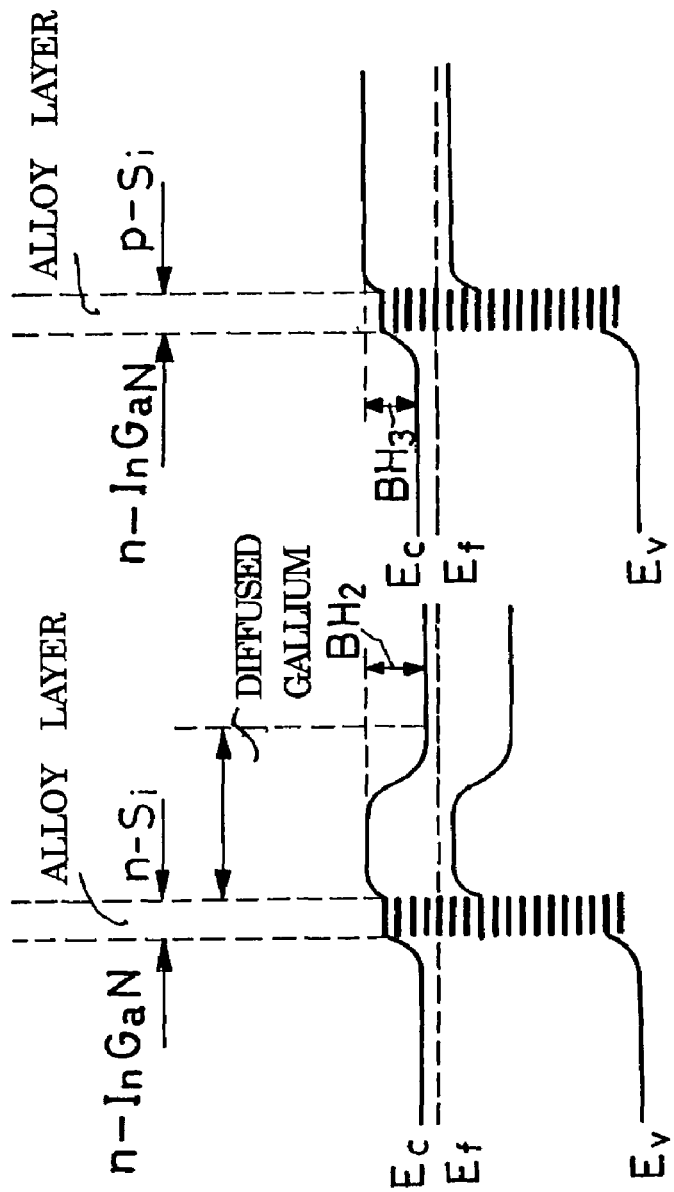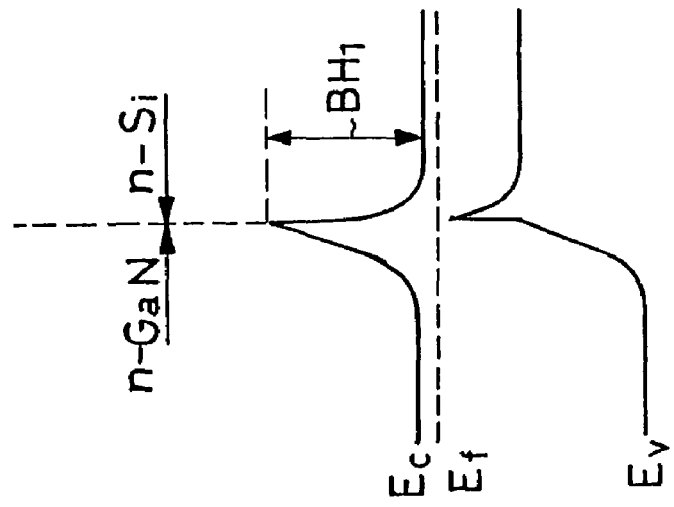

NITRIDE-BASED SEMICONDUCTOR DEVICE

CROSS REFERENCE TO RELATED APPLICATIONS

This is a continuation of Application PCT/JP2004/007849, filed May 31, 2004, which claims priority to Japanese Patent Application No. 2003-162394 filed Jun. 6, 2003 and Japanese Patent Application No. 2004-093516 filed Mar. 26, 2004.

BACKGROUND OF THE INVENTION

This invention relates to semiconductor devices such as light-emitting diodes (LEDs) and transistors, particularly to those employing nitrides or nitride-based compounds as semiconductors, and to a method of making such semiconductor devices.

Nitride-based semiconductor devices are capable of fabrication on substrates of either sapphire, silicon carbide, or silicon. Silicon in particular offers the advantages of being less expensive and easier of cutting than sapphire or silicon carbide. Unlike sapphire, moreover, silicon is electrically conductive and so lends itself to use as a current path. Offsetting these advantages of the silicon substrate is a relatively great voltage drop caused by the potential barrier between the silicon substrate and the nitride semiconductor. The nitride semiconductor LEDs with the silicon substrate have therefore required a drive voltage that is high enough to overcome the voltage drop.

Japanese Unexamined Paten Publication No. 2002-208729 teaches an LED configuration designed to preclude the noted shortcoming of the silicon substrate. It employs an n-type silicon substrate on which there is grown by epitaxy the main semiconductor region of the LED via a buffer region. The buffer region comprises an aluminum nitride (AlN) layer directly overlying the n-type silicon substrate, and an indium gallium nitride (InGaN) layer of the same n conductivity type as the silicon substrate on the AlN layer. The main semiconductor region comprises a lower cladding or confining layer of n-type gallium nitride (GaN), an active layer of InGaN, and an upper cladding or confining layer of p-type GaN.

In the course of the epitaxial growth of the successive layers of the buffer region and main semiconductor region of the prior art LED on the n-type silicon substrate, there occurs a partial diffusion of the aluminum of the lowermost AlN buffer layer, and of the indium and gallium of the overlying InGaN buffer layer, into the silicon substrate. The result is the creation, at the interface between silicon substrate and AlN layer, of a layer of the alloys or compounds of gallium, indium, aluminum and silicon. This alloy layer, as it might be so called, is in itself advantageous from the standpoint of LED efficiency as it reduces the potential barrier of the heterojunction between silicon substrate and AlN layer and so enables the LED to operate with a lower drive voltage than in the presence of the potential barrier. The LED is thus made less in power loss and higher in efficiency.

The trouble, however, is that aluminum, indium and gallium diffuse deeper down into the silicon substrate from the alloy layer. These Group III elements represent p-type impurities in the n-type silicon substrate, so that a pn junction was conventionally created in the substrate under the alloy layer. This applicant has ascertained that the pn junction caused a forward voltage drop of 0.6 volt or so. The residual potential barrier between the silicon substrate and the nitride semiconductor layers thereon was still so high that the voltage drop across this prior art LED (in other words, its drive voltage) was approximately 1.2 times as great as that across the sapphire-substrate LED. This shortcoming of the n-type silicon substrate in conjunction with the nitride semiconductor layers grown thereon manifests itself not only with LEDs but with transistors and other types of semiconductor devices of comparable make.

Another problem with LEDs concerns the electrodes that meet the dual, sometimes contradictory, requirements of enabling the emission of light therethrough and providing electric connections. A typical conventional solution was the creation of a transparent electrode, as of a mixture of indium oxide and tin oxide, on the light-emitting surface of the semiconductor chip, and on this transparent electrode, a metal-made bonding pad for connection of wire. The metal material of the bonding pad is easy to diffuse into the transparent electrode and even into the semiconductor region, the transparent electrode being as thin as, say, ten nanometers. A Schottkey barrier was therefore easy to be formed between the bonding pad and the semiconductor region. Blocking the forward current of the LED, the Schottkey barrier reduced current flow under the bonding pad and added to current flow through the outer parts of the semiconductor region.

As the n-type silicon substrate necessitates as aforesaid the application of a high drive voltage forwardly of the LED, both silicon substrate and semiconductor region cause greater power losses and generate more heat. The noted Schottkey barrier deteriorates as a consequence, permitting greater current flow therethrough and, in turn, causing reduction of current flow through the outer parts of the semiconductor region. The greater amount of light generated at the central part of the semiconductor region hardly leads to a greater amount of light actually emitted from the LED, because the bonding pad is impermeable to the light. Furthermore, with the reduction of current flow through the outer parts of the semiconductor region, a correspondingly less amount of light is generated and emitted through the transparent electrode. The prior art LEDs having nitride semiconductors on n-type silicon substrates were therefore mostly unsatisfactory in the efficiency of light emission.

It has been known to provide a current blocking layer of electrically insulating material between the bonding pad and the semiconductor region. This solution is objectionable because of the additional manufacturing steps, and consequent higher manufacturing costs, needed for fabrication of the current blocking layer.

SUMMARY OF THE INVENTION

The present invention seeks, in a semiconductor device having nitride-based semiconductor regions grown on a silicon substrate, to minimize the voltage drop therebetween and to make it possible for the semiconductor device to be driven with a less voltage than heretofore.

Briefly, the invention may be summarized as a nitride-based semiconductor device such as an LED or transistor capable of operation at a less drive voltage than heretofore. Included is a substrate of p-type silicon having sufficient conductivity to provide a current path. A buffer region of an n-type nitride semiconductor is grown epitaxially on one of the opposite major surfaces of the substrate. A main semiconductor region is grown epitaxially on the buffer region to provide a desired semiconductor device. An electrode is formed on the main semiconductor region, and another on the other major surface of the substrate. Also included is an alloy layer formed in the substrate to a prescribed depth from said one major surface thereof by thermal dispersion of p-type impurities from at least the buffer region during the epitaxial growth of the main semiconductor region.

The most pronounced feature of the invention resides in the p-type silicon substrate in combination with the buffer layer of one or more n-type nitride semiconductors containing group III elements such as gallium and aluminum. These elements represent p-type impurities with respect to silicon, so that no pn junction is created in the p-type silicon substrate.

The alloy layer functions to cause electrons and holes to be generated at its interface with the p-type silicon substrate and these electrons and holes to recombine. The result is the reduction of the potential barrier of the heterojunction between the p-type silicon substrate and the n-type buffer region. This fact, combined with the absence of a pn junction from the substrate, makes it possible to make the drive voltage of the semiconductor device drastically less than heretofore.

The buffer region contributes to the fabrication of the main semiconductor region of good crystallinity thereon.

In an LED built upon the concepts of this invention, the noted electrode on the main semiconductor region can be of the known design comprising a transparent film covering the light-emitting surface of the main semiconductor region, and a bonding pad on part of the transparent film. In this case, as has been stated with respect to the prior art, a Schottkey barrier will be created between the bonding pad and the semiconductor region, blocking the forward current of the LED. However, should the LED have great power loss and easily generate heat, the Schottkey barrier would not function properly to block the forward current. No such deterioration in the function of the Schottkey barrier will occur in the LED of this invention because it causes much less power loss and generates much less heat than the prior art.

The above and other objects, features and advantages of this invention will become more apparent, and the invention itself will best be understood, from a study of the following description and appended claims, with reference had to the attached drawings showing the preferred embodiments of the invention.

BRIEF DESCRIPTION OF THE DRAWINGS

FIGS. 3A, 3B and 3C are energy band diagrams of two prior art LEDs and the LED of FIG. 1.

DESCRIPTION OF THE PREFERRED EMBODIMENTS

Figure 1:
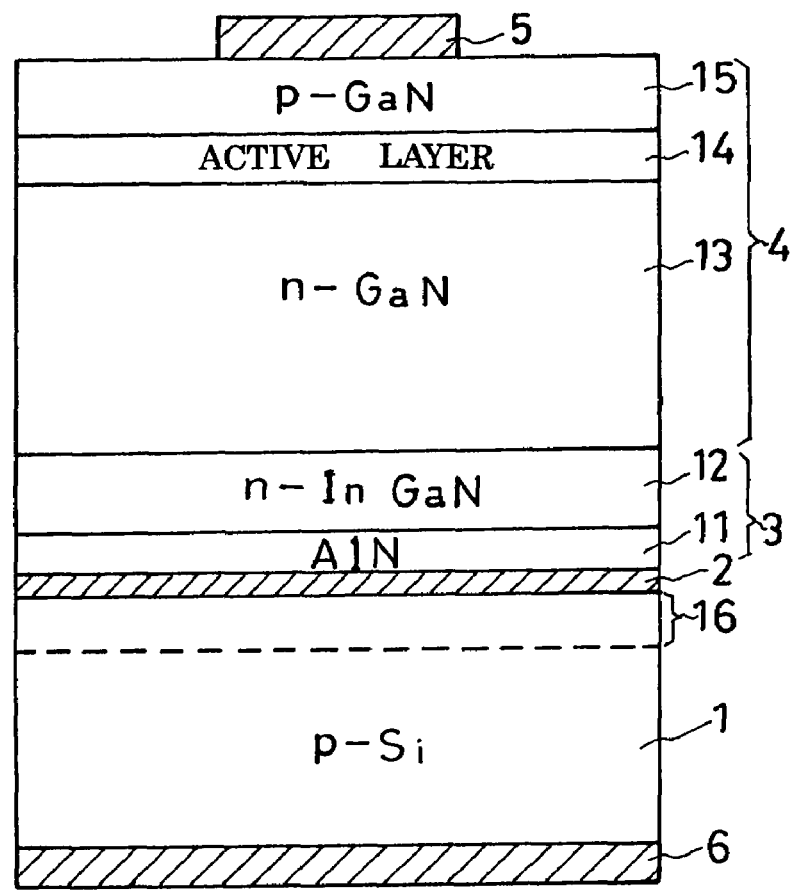
FIG. 1 is a schematic cross section through an LED embodying the principles of this invention.

The nitride-based semiconductor device according to the invention will now be described more specifically in terms of the LED shown in FIG. 1. The exemplified LED broadly comprises:

1. A p-type silicon substrate 1.
2. An alloy layer 2 formed in (or directly on) the silicon substrate 1.
3. A buffer region 3 formed on the alloy layer 2 by being grown epitaxially on the silicon substrate 1.
4. A main semiconductor region 4 grown epitaxially on the buffer region 3 and constituting the primary working part of the LED.
5. A top electrode or anode 5 placed centrally on the exposed major surface of the main semiconductor region 4.
6. A bottom electrode or cathode 6 covering the complete underside of the silicon substrate 1.

The buffer region 3 is subdivided into a first buffer layer 11 shown overlying the alloy layer 2, and a second buffer layer 12 of n-type on the first buffer layer. The main semiconductor region 4 is a lamination of an n-type nitride semiconductor layer 13, active layer 14, and p-type nitride semiconductor layer 15, in that order from the buffer region 3 toward the top electrode 5. The light generated at the active layer 4 issues from the exposed major surface of the semiconductor region 4 on which is formed the top electrode 5.

Constituting a feature of this invention, the p-type silicon substrate 1 is made opposite in conductivity type to the overlying n-type second buffer layer 12. The silicon substrate 1 gains the p conductivity type by being doped with a p-type impurity of boron or like Group III element to a concentration of from $5\times10^{18}$ cm$^{-3}$ to $5\times10^{19}$ cm$^{-3}$. This p-type silicon substrate 1 is therefore electrically conducting, being as low in resistivity as from 0.0001 to 0.0100 ohm-centimeter, providing part of a current path between the electrodes 5 and 6 in use of the LED. Additionally, of course, the silicon substrate 1 must mechanically support the buffer region 3 and main semiconductor region 4, so that it must be sufficiently thick (e.g. 350 micrometers) to perform this function.

The alloy layer 2 on the p-type silicon substrate 1 is constituted of an alloy of silicon, gallium, indium and aluminum in this embodiment of the invention. So constituted, the alloy layer 2 causes both electrons and holes to be generated at its interface with the substrate 1 and at that with the buffer region 3, and these electrons and holes to be recombined. The alloy layer 2 could therefore be termed the potential barrier mitigation layer, serving, as it does, to reduce the potential barrier between silicon substrate 1 and buffer region 3. The alloy layer 2 may be either constant or otherwise in thickness. At any event, for sufficiently performing the desired function of potential barrier mitigation, the alloy layer 2 should average not less than five nanometers in thickness. How the alloy layer 2 is created will be detailed later.

Overlying the alloy layer 2, the buffer region 3 is constituted of the first buffer layer 11 which is made from a nitride semiconductor containing a prescribed proportion of aluminum, and the second buffer layer 12 which is made from an n-type nitride semiconductor that either does not contain aluminum or does contain aluminum in a less proportion than the first buffer layer 11 does.

The nitride semiconductors adoptable for the first buffer layer 11 can be generally defined as:

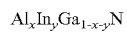

where the subscript x is a numeral that is greater than zero and equal to or less than one; the subscript y is a numeral that is equal to or greater than zero and less than one; and the sum of x and y is greater than zero and equal to or less than one. Aluminum nitride (AlN, x=1, y=0) is employed in this particular embodiment for the first buffer layer 11.

The first buffer layer 11 is from one to 60 nanometers thick, preferably, for offering the quantum-mechanical tunnel effect, from one to 10 nanometers, and most desirably from two to three nanometers. The first buffer layer 11 is approximately three nanometers thick in this particular embodiment.

Optionally, the first buffer layer 11 may be doped with an n-type impurity such as silicon. It is also possible to add boron to the first buffer layer 11. The nitride semiconductor materials possibly including boron for the first buffer layer 11 are generally defined as:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one.

In order for the second buffer layer 12 of a gallium-containing nitride semiconductor to favorably conform to the crystal face orientation of the p-type silicon substrate 1, the first buffer layer 11 of an aluminum-containing nitride semiconductor should be made from a material such that the difference in lattice constant between this first buffer layer and the silicon substrate is less than the difference in lattice constant between the second buffer layer and the silicon substrate. Also, the difference in coefficient of thermal expansion between the first buffer layer 11 and the silicon substrate 1 should be less than the difference in that between the second buffer layer 12 or main semiconductor region 4 (or those designated $4_a$-$4_c$ in the subsequent embodiments of the invention) and the silicon substrate. Further, for effectively retarding the diffusion of indium and gallium from second buffer layer 12 to silicon substrate 1, the first buffer layer 11 should be from two to 60 nanometers thick.

The second buffer layers 12 is made from, in addition to an n-type determinant, any of the nitrides that contains gallium at least and that are generally expressed by the formula:

$$Al_aIn_bGa_{1-a-b}N$$

where the subscript a is a numeral that is equal to or greater than zero and less than one and, additionally, less than the subscript x in the formula above defining the materials for the first buffer layer 11; and the subscript b is a numeral that is equal to or greater than zero and less than one and, additionally, greater than the subscript y in the formula above defining the materials for the first buffer layer 11. The second buffer layer 12 is formed from an n-type indium gallium nitride ($In_{0.5}Ga_{0.5}N$) to a thickness of 30 nanometers in this embodiment of the invention.

Boron may be added to this second buffer layer 12, too, as required or desired. The nitride semiconductor materials possibly including boron for the second buffer layer 12 are generally defined as:

$$Al_aM_bGa_{1-a-b}N$$

where M is at least either of indium and boron; the subscript a is a numeral that is equal to or greater than zero and less than one and, additionally, less than the subscript x in the formula above defining the materials for the first buffer layer 11; the subscript b is a numeral that is equal to or greater than zero and equal to or less than one; and the sum of a and b is equal to or less than one.

The compositions of the buffer layers 11 and 12 are subject to change in the course of their epitaxial growth because of the diffusion of the elements into and from the neighboring regions. The above noted compositions of the buffer layers 11 and 12 should therefore be understood to be the starting compositions.

The second buffer layer 12 containing gallium and indium serves not just as a buffer between the silicon substrate 1 and the main semiconductor region 4 but as a source for supplying gallium and indium into the silicon substrate 1 during epitaxial growth. The thickness of the second buffer layer 12 should be at least one nanometer for supplying sufficient amounts of gallium and indium into the silicon substrate 1 and not more than 500 nanometers to prevent cracking.

For providing an LED of double heterodyne structure, the main semiconductor region 4 is comprised as aforesaid of the n-type nitride semiconductor layer 13, active layer 14, and p-type nitride semiconductor layer 15. The n-type nitride semiconductor layer 13 is made from, in addition to an n-type dopant, any of the nitride semiconductors that are generally expressed as:

$$Al_xIn_yGa_{1-x-y}N$$

where the subscripts x and y are both numerals that are equal to or greater than zero and less than one. The n-type nitride semiconductor layer 13 of this embodiment of the invention is made from n-type GaN (both x and y are zero in the formula above) to a thickness of approximately two micrometers. The n-type nitride semiconductor layer 13 is called the lower cladding of the active layer 14 in LED terminology.

The active layer 14 can be fabricated for example from nitride semiconductors that are generally expressed as:

$$Al_xIn_yGa_{1-x-y}N$$

where the subscripts x and y are both numerals that are equal to or greater than zero and less than one. The active layer 14 of this embodiment of the invention is made from InGaN. In practice the active layer 14 may take the form of the familiar multiple quantum well structure comprising a multiplicity of barrier sublayers, well sublayers and so forth. A single quantum well construction is adoptable as well. Optionally, moreover, the active layer 14 may be doped with either p- or n-type conductivity type determinant.

The p-type nitride semiconductor layer 15, the upper cladding of the active layer 14, is made from, in addition to a p-type dopant, any of the nitride semiconductors that are generally defined by the formula:

$$Al_xIn_yGa_{1-x-y}N$$

where the subscripts x and y are both numerals that are equal to or greater than zero and less than one. The n-type nitride semiconductor layer 13 of this embodiment of the invention is made from p-type GaN to a thickness of approximately 500 nanometers.

All formed on the silicon substrate 1 via the buffer region 3, the n-type nitride semiconductor layer 13, active layer 14 and p-type nitride semiconductor layer 15 of the main semiconductor region 4 are favorable in crystallinity.

The anode 5 is positioned centrally on the surface of the p-type nitride semiconductor layer 15 and electrically connected thereto. A contact layer of a p-type nitride semiconductor could be interposed between the anode 5 and the p-type nitride semiconductor layer 15. The cathode 6 is joined to the underside of the p-type silicon substrate 1.

Method of Fabrication

What follows is the disclosure of a preferred method of making the LED of the FIG. 1 construction. The method started with the preparation of the p-type silicon substrate 1. The major surface of the silicon substrate 1, on which was to be formed the buffer region 3, was (111) in terms of Miller indices. This substrate was then treated with an etchant containing hydrogen fluoride.

Introduced into the reactor of a commercially available organometallic vapor phase epitaxy (OMVPE) system, the silicon substrate 1 was first heated to 1170° C. and held at this temperature for 10 minutes by way of thermal cleaning for stripping the oxide film off its surfaces. Then, with the reactor temperature lowered to a stable 1100° C., trimethylaluminum (TMA) gas and ammonia ($NH_3$) gas were charged into the reactor, thereby growing by OMVPE the first buffer layer 11 of AlN to a thickness of three nanometers on the surface of the substrate 1. The TMA gas was charged at a rate of 63 micromoles per minute, and the $NH_3$ gas at a rate of 0.14 mole per minute.

Then, with the supply of TMA gas terminated and the substrate temperature lowered to 950° C., trimethylgallium (TMG) gas, $NH_3$ gas and silane ($SiH_4$) gas were introduced into the reactor at the rates, respectively, of 59 micromoles per minute, 6.2 micromoles per minute, 0.23 moles per minute, and 21 nanomoles per minute. There was thus grown on the first buffer layer 11 of AlN the second buffer layer 12 of n-type $In_{0.5}Ga_{0.5}N$ to a thickness of approximately 30 nanometers. The $SiH_4$ gas was intended for addition of silicon into the InGaN buffer 12 as an n-type dopant.

Both gallium and indium included in the second buffer layer 12 are intrinsically capable of diffusing into the neighboring layers. By virtue of the interposition of the first buffer layer 11 of AlN, however, these elements hardly find their way into the silicon substrate 1. This substrate is therefore little affected in crystallinity during the epitaxial growth of the second buffer layer 12.

Next came the steps of successively growing the three constituent layers 13, 14 and 15 of the main semiconductor region 4 on the second buffer layer 12. The n-type nitride semiconductor layer 13 of n-type GaN was first created by introducing TMG gas, $NH_3$ gas and $SiH_4$ gas into the OMVPE reactor, with the substrate 1, together with the buffer layers 11 and 12 thereon, held at a temperature of 1110° C. The TMG gas was introduced into the OMVPE reactor at a rate of 4.3 micromoles per minute, the $NH_3$ gas at 53.6 millimoles per minute, and the $SiH_4$ gas at 1.5 nanomoles per minute.

The n-type nitride semiconductor layer 13 of n-type GaN was thus grown to a thickness of two micrometers by way of the lower cladding of the active layer 14 yet to be formed. The impurity concentration of this semiconductor layer 13 was approximately $3\times10^{18}$ $cm^{-3}$, less than that of the substrate 1. As the underlying second buffer layer 12 had been favorable in crystallinity before fabrication of the n-type nitride semiconductor layer 13 thereon, so was this semiconductor layer 13. Some limited amounts of gallium and indium diffused into the first buffer layer 11 of AlN toward the end of the creation of the n-type nitride semiconductor layer 13, but the alloy layer 2 was not yet formed. An intentional diffusion of gallium and indium into the substrate 1 is possible during the creation of the n-type nitride semiconductor layer 13 by adjustment of the thickness of the first buffer layer 11.

The next step was the creation of the active layer 14 of multiple quantum well configuration which in this case was a lamination of alternating four barrier sublayers and four well sublayers. One barrier sublayer was first formed on the n-type nitride semiconductor layer 13. Toward this end the OMVPE reactor temperature was lowered to 800° C., and the gases of TMG, TMI and $NH_3$ were charged into the reactor at prescribed rates. The barrier sublayer was grown to a thickness of 13 nanometers, and its composition was $In_{0.02}Ga_{0.98}N$.

Then one well sublayer was grown on the barrier sublayer by approximately the same method as that for fabrication of the barrier sublayer except for a change in the rate of introduction of TMI. The resulting well sublayer had the composition $In_{0.2}Ga_{0.8}N$ and was three nanometers thick.

The foregoing processes of fabricating one barrier sublayer and one well sublayer were cyclically repeated four times to complete the multiple quantum well active layer 14. Formed on the n-type nitride semiconductor layer 13 of good crystallinity, the active layer 14 was just as favorable in crystallinity. The active layer 14 could have been doped with a p-type impurity.

Gallium and indium diffused from the second buffer layer 12 into the substrate 1 via the first buffer layer 11, and aluminum from the first buffer layer 11 into the substrate 1, during the fabrication of the active layer 14 as above. The alloy layer 2 of silicon, gallium, indium and aluminum was created to a certain depth from the surface of the substrate 1 toward the end of the fabrication of the active layer 14. The period of formation of the alloy layer 2 is adjustable by the thickness of the first buffer layer 11. Obviously, not all the gallium, indium and aluminum particles that have been diffused into the substrate 1 create the alloy layer 2 in combination with the preexisting silicon, but some of them will be dispersed deeper into the silicon substrate to create a region 16 where the p-type impurities are dispersed. No reversal of the conductivity type will occur, however, because the silicon substrate 1 also is of p-type conductivity.

The next step was the fabrication of the p-type nitride semiconductor layer 15, FIG. 1, the upper cladding of the active layer 14 which had been completed as above. The OMVPE reactor temperature was raised to 1110° C., and there were introduced into this reactor the gases of TMG, $NH_3$, and bis-cyclo pentadienylmagnesium ($Cp_2Mg$). The TMG gas was introduced at a rate of 4.3 micromoles per minute, the $NH_3$ gas at 53.6 micromoles per minute, and $Cp_2Mg$ at 0.12 micromoles per minute. Intended for addition of magnesium to the p-type nitride semiconductor layer 15 as a p-type conductivity determinant, the $Cp_2Mg$ gas was introduced into the reactor to a concentration of $3\times10^{18}$ $cm^{-3}$. There was thus grown on the surface of the active layer 14 the p-type nitride semiconductor layer 15 of p-type GaN to a thickness of 500 nanometer.

The production of the LED was completed as the electrodes 5 and 6 were conventionally formed by vacuum vapor deposition.

Figure 2:
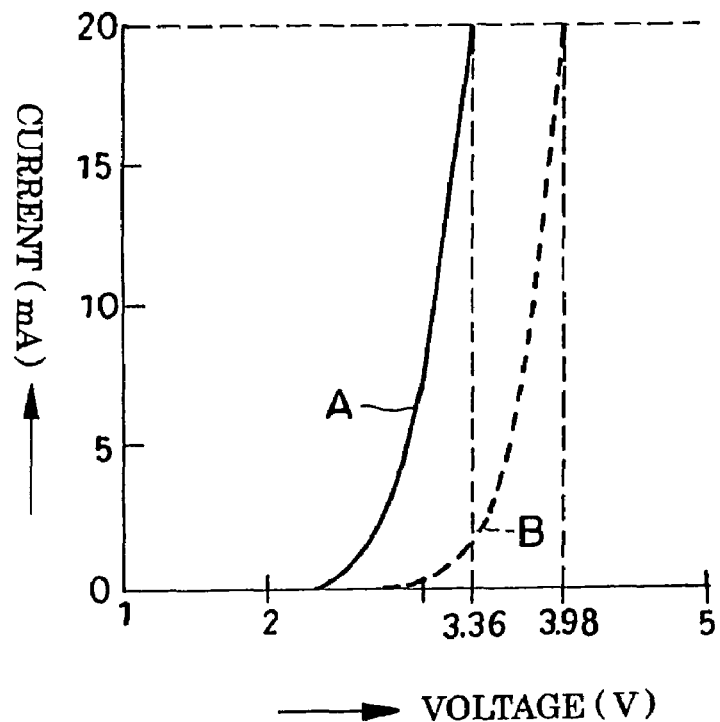
FIG. 2 is a graph plotting the curve of the current flowing through the LED of FIG. 1 against the forward drive voltage, together with a similar curve exhibited by the prior art LED of comparable make having an n-type silicon substrate.

The solid line curve A in the graph of FIG. 2 represents the magnitude, in milliamperes, of current flowing through the LED of the FIG. 1 construction manufactured as above, against a forward voltage in volts applied thereto (top electrode 5 positive and bottom electrode 6 negative). The dashed line curve B in the same graph represents the magnitude of the current flowing through the LED of the noted prior art construction having the n-type silicon substrate, against a forward voltage. The graph indicates that for current flow of 20 milliamperes, the inventive LED requires a drive voltage of 3.36 volts whereas the prior art LED demands that of 3.98 volts. A 0.62 volt reduction in drive voltage is achieved for current flow of 20 milliamperes by the simplest possible method of altering the conductivity type of the silicon substrate 1 from n top.

FIGS. 3A-3C are energy band diagrams given in three different cases of LED construction, two according to the prior art and one according to the invention, by way of explanation of why the forward drive voltage is reducible with the p-type silicon substrate according to the invention. In all these diagrams the indicia $E_c$ denotes the conduction band, $E_v$ the valance band, and $E_f$ the Fermi level. A relatively high potential barrier $BH_1$ is created as in FIG. 3A when the n-type GaN layer (designated n-GaN) is epitaxially grown on the prior art n-type silicon substrate (n-Si).

In FIG. 3B is shown the energy band between the substrate and the n-Si substrate and the n-InGaN layer of the noted prior art LED in the case where the AlN buffer layer 11 is made negligibly thin. As the alloy layer is created to some depth from the surface of the n-Si substrate, the potential barrier of no such great height $BH_1$ as in FIG. 3A is formed. However, by reason of the presence of the diffused gallium region of p-type conductivity in the n-Si substrate, a pn junction is formed with the consequent creation of the potential barrier of less height $BH_2$.

FIG. 3C represents the case where the p-type silicon substrate p-Si according to the invention is employed as in FIG. 1. The diffusion of gallium, indium and aluminum, all p-type impurities, into the p-type silicon substrate does not result in the creation of a pn junction. Furthermore, although a potential barrier of height $BH_3$ exists between the n-InGaN layer and p-Si layer, the resulting voltage drop is negligible not only because the height $BH_3$ is less than the height $BH_2$, FIG. 3B, but because of the presence of the alloy layer.

The foregoing will have made clear that the present invention succeeds in the substantive reduction of the drive voltage of the LED without in any way adversely affecting the crystallinity of the main semiconductor region 4. This advantageous effect results from use of the p-type silicon substrate 1 despite the overlying n-type buffer region 3. Dispersed into this silicon substrate from the buffer region 3, the Group III elements of aluminum, gallium and indium do not create pn junctions in the substrate as they are p-type impurities in the p-type substrate. The p-type silicon substrate according to the invention is free from the voltage drop heretofore encountered with the conventional n-type silicon substrate.

Additionally, the alloy layer 2 generates electrons and holes at its interface with the p-type silicon substrate 1 and causes their recombinations, resulting in the reduction of the potential barrier due to the heterojunction between the p-type silicon substrate 1 and the n-type buffer region 3. All in all, a drastic reduction is attained in the drive voltage of the LED.

The buffer region 3 is conducive to the provision of the main semiconductor region 4 of good crystallinity.

Figure 4:
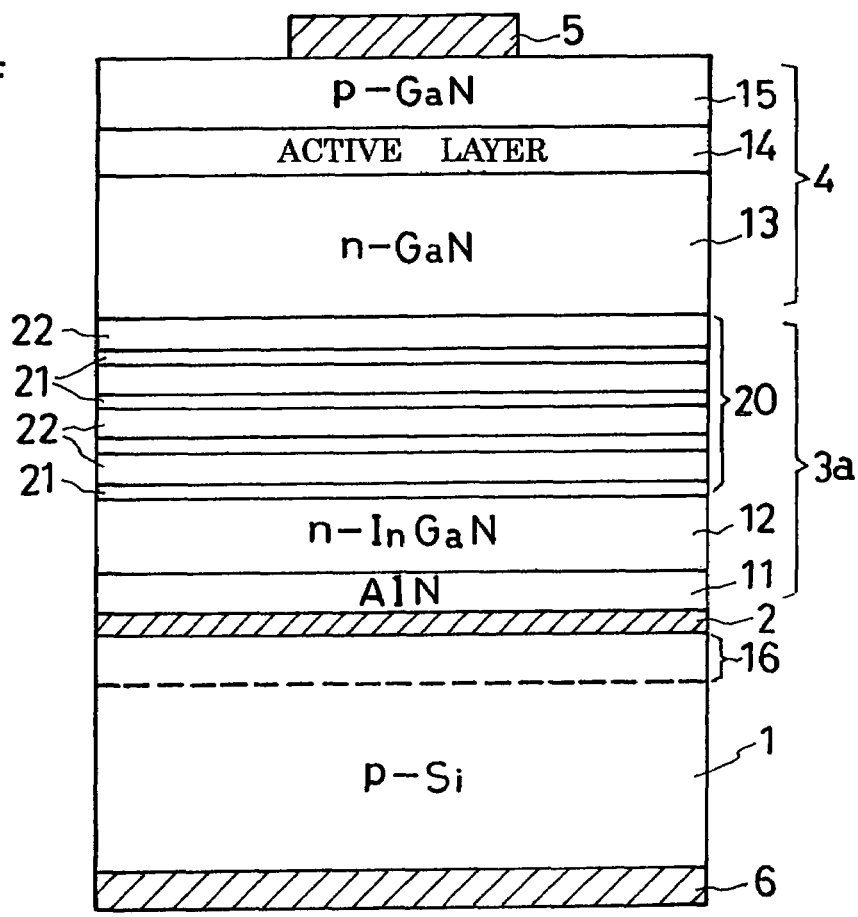
FIG. 4 is a schematic cross section through another preferred form of LED according to the invention.

Embodiment of FIG. 4

The LED shown in FIG. 4 by way of another preferred embodiment of the invention is akin to the FIG. 1 embodiment except for a modified buffer region $3_a$. The modification resides in a multilayered buffer subregion 20 interposed between the buffer layer 12 and the n-type nitride semiconductor layer 13 of the main semiconductor region 4. The multilayered buffer subregion 20 is an alternation of a plurality or multiplicity of first buffer sublayers 21 and a plurality or multiplicity of second buffer sublayers 22. The first buffer sublayers 21 are made from a nitride semiconductor containing a prescribed proportion of aluminum, and the second buffer sublayers 22 from a nitride semiconductor that either does not contain aluminum or does contain aluminum in a less proportion than do the first buffer sublayers 21.

The aluminum-containing nitride semiconductor materials adoptable for the first buffer sublayers 21 are generally defined as:

$Al_xM_yGa_{1-x-y}N$ where M is at least either of indium and boron; the subscript x is a numeral that is greater than zero and equal to or less than one; the subscript y is a numeral that is equal to or greater than zero and less than one; and the sum of x and y is equal to or less than one. The first buffer sublayers 21 may be from one to 10 nanometers thick for providing the quantum-mechanical tunnel effect. In this particular embodiment the first buffer sublayers 21 are made from aluminum nitride, although an n-type dopant such as silicon could be added.

The nitride semiconductor materials that may, or may not, contain aluminum for the second buffer sublayer 22 are generally defined as:

$Al_aM_bGa_{1-a-b}N$ where M is at least either of indium and boron; the subscript a is a numeral that is equal to or greater than zero and less than one and, additionally, less than the subscript x in the formula above defining the materials for the first buffer sublayers 21; the subscript b is a numeral that is equal to or greater than zero and equal to or less than one; and the sum of a and b is equal to or less than one. Silicon may be added to any such materials as an n-type dopant. Preferably, the second buffer sublayers 22 should be of the same material, n-type GaN in this embodiment, as the second buffer layer 12. The second buffer sublayers 22 should be 10 micrometers or more thick for giving rise to no quantum-mechanical energy level.

The LED of FIG. 4 other than the multilayered buffer subregion 20 is manufacturable by the same method as that described above for the FIG. 1 LED. For fabrication of the multilayered buffer subregion 20 of the modified buffer region $3_a$, TMA, $SiH_4$ and $NH_3$ were introduced into the reactor at the rates, respectively, of 50 micromoles per minute, 20 nanomoles per minute, and 0.14 moles per minute, until one first buffer sublayer 21 of AlN grew to a thickness of five nanometers on the second buffer layer 12. Then, with the charging of TMA terminated, that of $SiH_4$ and $NH_3$ was continued, together with TMG additionally supplied at a rate of 50 micromoles per minute, until one second buffer sublayer 22 of GaN grew to a thickness of 25 nanometers on the first buffer sublayer 21. The same process of growing one first buffer sublayer 21 and one second buffer sublayer 22 was repeated twenty times to complete the fabrication of the multilayered buffer subregion 20. Only four first buffer sublayers 21 and four buffer sublayers 22 are shown in FIG. 4 for simplicity.

The addition of the multilayered buffer subregion 20, as above, offers the advantage of a higher flatness of the top surface of the buffer region $3_a$.

As a modification of the FIG. 4 LED, the buffer sublayers 21 and 22 may be made the same in composition with the buffer layers 11 and 12, respectively. The buffer layers 11 and 12 will then constitute parts of a multilayered buffer region.

Figure 5:
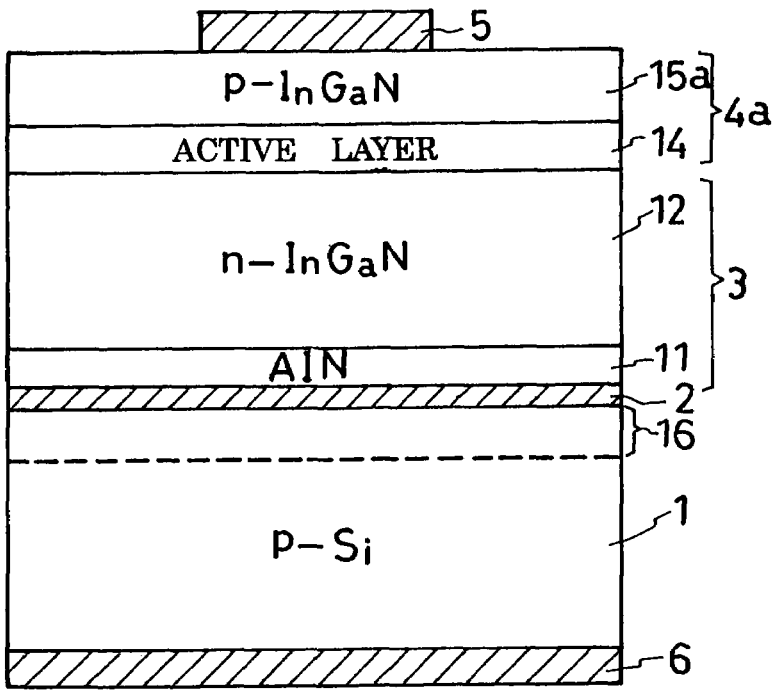
FIG. 5 is a schematic cross section through still another preferred form of LED according to the invention.

Embodiment of FIG. 5

FIG. 5 illustrates still another preferred form of LED according to the invention, which is similar in construction to the FIG. 1 LED except that the former does not have the n-type nitride semiconductor layer 13 of the latter, and that the p-type nitride semiconductor region 15 of p-type GaN in the FIG. 1 LED is replaced by that, designated $15_a$, of p-type InGaN in this FIG. 5 LED. The main semiconductor region $4_a$ of this LED is therefore comprised of the active layer 14 and p-type nitride semiconductor region $15_a$. Although the active layer 14 has no dedicated lower cladding, the n-InGaN layer of the buffer region 3 serves the purpose of the n-GaN layer 13 of the FIG. 1 LED. This embodiment therefore offers the same advantages as does that of FIG. 1.

Figure 6:
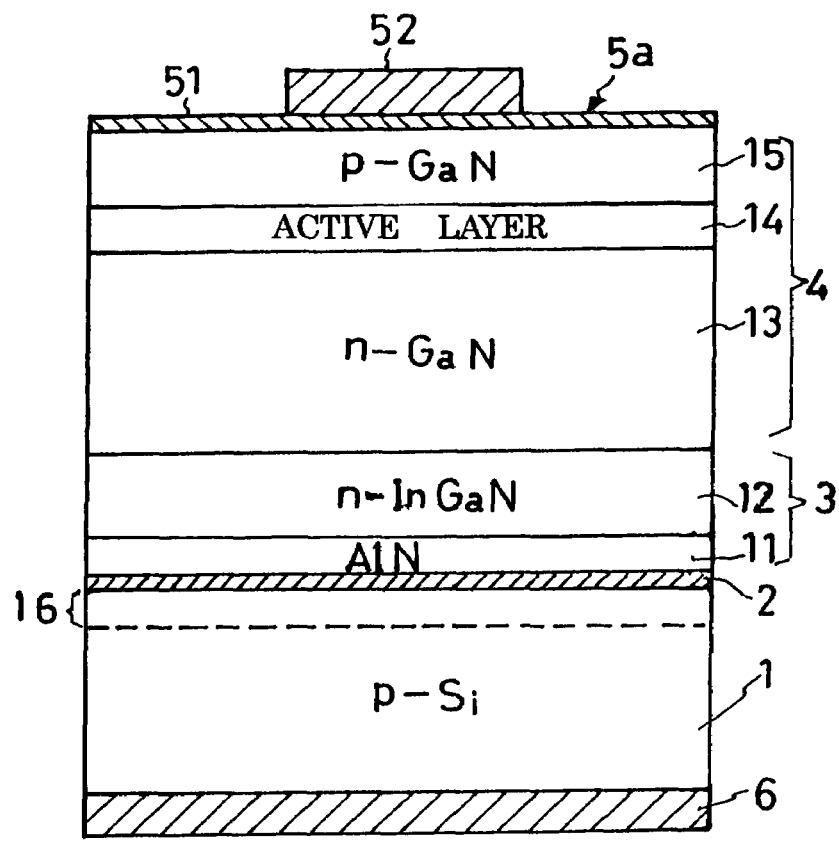
FIG. 6 is a schematic cross section through yet another preferred form of LED according to the invention.

Embodiment of FIG. 6

A modified top electrode $5_a$ is incorporated in the LED shown in FIG. 6 in substitution for the electrode 5 of the FIG. 1 embodiment. The FIG. 6 LED is identical with that of FIG. 1 in all the other details of construction. The modified top electrode $5_a$ comprises a transparent film 51 of electrically conducting material and a bonding pad 52 thereon. The transparent film 51 covers the entire exposed major surface of the main semiconductor region 4, or of its p-type nitride semiconductor region 15. The bonding pad 52 is formed approximately centrally on the transparent film 51, leaving outer, marginal part of the transparent film 51 exposed for light emission.

Fabricated from indium oxide ($In_2O_3$), stannic oxide ($SnO_2$), or a mixture of the two, the transparent film 51 is permeable to the light generated in the active layer 14. The transparent film 51 is approximately 10 nanometers thick and makes ohmic contact or resistive contact with the p-type nitride semiconductor region 15.

The bonding pad 52 on the other hand is made of metal such as nickel, gold, or aluminum, to a sufficient thickness to permit wire bonding. Made so thick, the bonding pad 52 is impermeable to the light from the active layer 14. Preferably, the bonding pad 52 is made from a metal such that a Schottky barrier is created between itself and the p-type nitride semiconductor layer 15. Such a metal will be dispersed into the transparent film 51 and thence into the main semiconductor region 4 during the fabrication of the bonding pad or in the subsequent steps of LED manufacture, thereby creating a Schottky barrier between the bonding pad and the main semiconductor region.

Current will flow from the transparent film 51 to the main semiconductor region 4 upon application of a forward voltage between the electrodes $5_a$ and 6, the "forward" voltage being such that the top electrode $5_a$ is at a higher potential than the bottom electrode 6. Since the bonding pad 52 makes Schottky contact with the main semiconductor region 4, hardly any current will flow through the Schottky barrier between them. As a result, current will flow mostly through outer, peripheral part of the main semiconductor region 4 (i.e. part out of register with the bonding pad 52) from electrode $5_a$ to electrode 6. The light thus generated at the active layer 4 by the current flowing through the outer part of the main semiconductor region 4 can issue through the marginal part of the transparent film 51 without being impeded by the opaque bonding pad.

As has been explained, the Schottky barrier deteriorates with a rise in the temperature of the LED, permitting greater current leakage therethrough. The heating of the LED should therefore be avoided as far as possible. Fabricated on the p-type silicon substrate 1 as the FIG. 1 LED is, this FIG. 6 LED operates with a lower forward drive voltage, causing less power loss and generating less heat, than the prior art devices on the n-type silicon substrate. The Schottky barrier between the bonding pad 52 and the main semiconductor region 4 is thus prevented from deterioration due to the heating of the silicon substrate 1 and main semiconductor region 4. Assuming that the same amount of current flows between the electrodes $5_a$ and 6 as in the prior art LED having the n-type silicon substrate, a greater proportion of this current will flow as aforesaid through the outer part of the main semiconductor region 4, causing light to be generated with a higher efficiency than in the prior art LED. Furthermore, if the main semiconductor region 4 and silicon substrate 1 are to be allowed to generate as much heat as in the prior art LED with the n-type silicon substrate, current of greater magnitude than heretofore may be made to flow through the outer part of the main semiconductor region for emission of greater intensity light.

The top electrode configuration of FIG. 6 is applicable to the LEDs of FIGS. 4 and 5.

Figure 7:
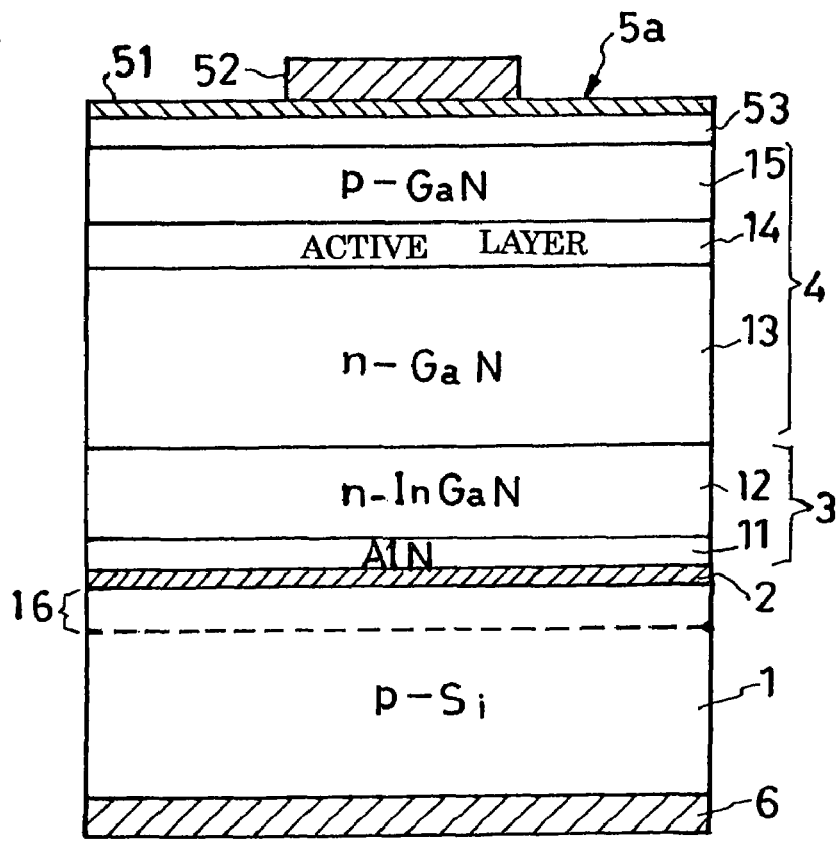
FIG. 7 is a schematic cross section through a further preferred form of LED according to the invention.

Embodiment of FIG. 7

The LED of FIG. 7 is identical in construction with that of FIG. 6 except for an additional n-type nitride semiconductor layer 53 interposed between the transparent film 51 of the top electrode $5_a$ and the p-type nitride semiconductor layer 15 of the main semiconductor region 4. The additional n-type nitride semiconductor layer 53 is made from, in addition to an n-type dopant, any of the nitride semiconductors that are generally expressed as:

where the subscripts x and y are both numerals that are equal to or greater than zero and less than one. The additional n-type nitride semiconductor layer 53 of this embodiment of the invention is made from n-type GaN.

In the case where the transparent film 51 is of a mixture of indium oxide and stannic oxide, which is similar in properties to n-type semiconductors, this transparent film and the additional n-type nitride semiconductor layer 53 make ohmic contact of such low resistivity that a further reduction of power loss is accomplished, permitting a further decrease in forward drive voltage and an increase in efficiency.

The pn junction between the p-type nitride semiconductor layer 15 and the additional n-type nitride semiconductor layer 53 should also offer minimal impediment to the flow of forward current therethrough. Toward this end, as well as for providing the quantum-mechanical tunnel effect, the additional n-type nitride semiconductor layer 52 may be from one to 30 nanometers, preferably from five to 10 nanometers, in thickness.

An application of forward voltage between the electrodes $5_a$ and 6 of this LED will result in current flow from the transparent film 51 into the p-type nitride semiconductor layer 15 via the additional n-type nitride semiconductor layer 53. The noted decrease in forward drive voltage is possible if the ohmic barrier between the transparent film 51 and the additional n-type nitride semiconductor layer 53 is sufficiently low, and the barrier between the additional n-type nitride semiconductor layer 53 and the p-type nitride semiconductor not so high.

The teachings of FIG. 7, both top electrode configuration $5_a$ and additional n-type nitride semiconductor layer 53, are applicable to the LEDs of FIGS. 4 and 5 as well.

Figure 8:
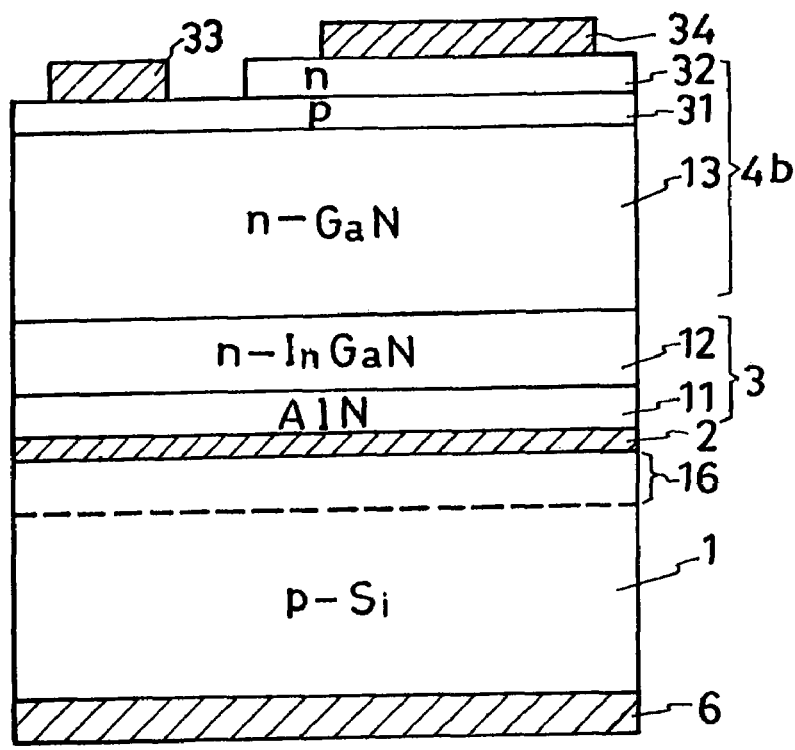
FIG. 8 is a schematic cross section through a transistor embodying the principles of the invention.

Embodiment of FIG. 8

The concepts of this invention are applicable not only to LEDs but to transistors too, as in FIG. 8, in which the main semiconductor region 4 of the FIG. 1 LED is reconfigured into that generally designated $4_b$ for providing a transistor. This transistor is similar to the FIG. 1 LED in all the details of construction other than the main semiconductor region $4_b$.

The main semiconductor region $4_b$ of the transistor comprises an n-type nitride semiconductor collector subregion 13 of the same composition (n-GaN) as the n-type nitride LED layer 13, a p-type nitride semiconductor base subregion 31 grown epitaxially on the collector subregion, and an n-type nitride semiconductor emitter subregion 32 grown epitaxially on the base subregion. A base electrode 33 is formed on the base subregion 31, and an emitter electrode 34 on the emitter subregion 32. The electrode 6 underlying the p-type silicon substrate 1 serves as the collector.

Being of npn type, this transistor is driven with the collector electrode 6 at the highest potential to cause current flow toward the emitter electrode 34. It is clear that the voltage drop between the two main electrodes 6 and 34 of the transistor is reduced as with the FIG. 1 LED.

Figure 9:
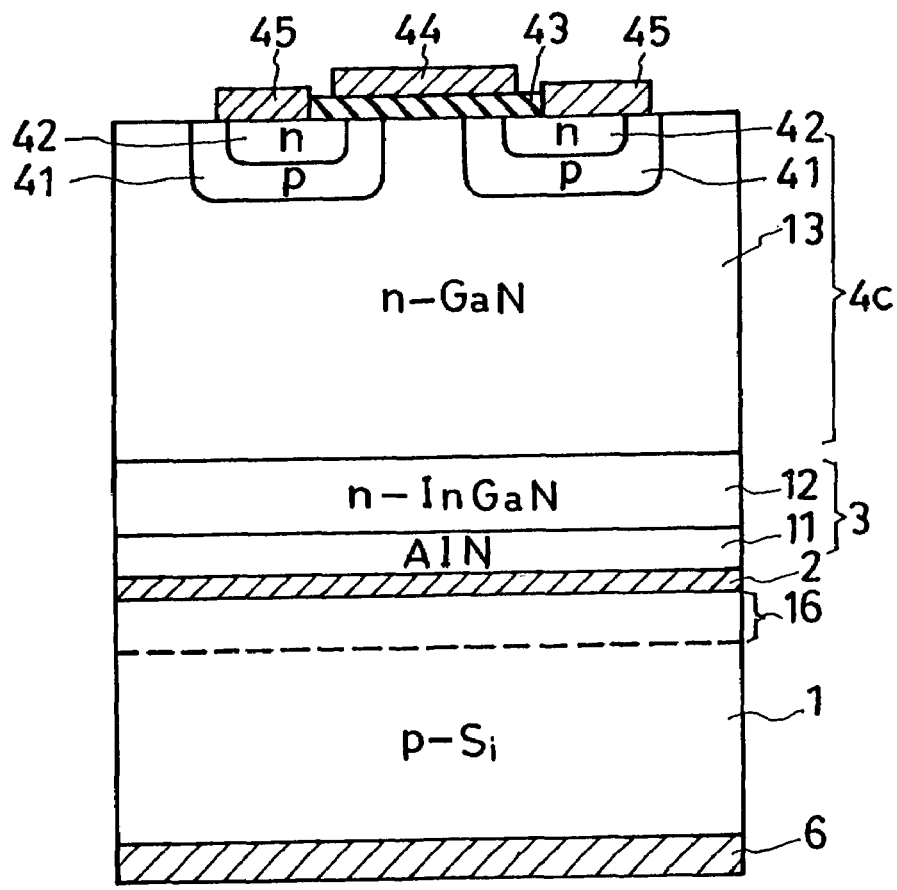
FIG. 9 is a schematic cross section through a field-effect transistor embodying the principles of the invention.

Embodiment of FIG. 9

FIG. 9 represents an application of the instant invention to an insulated-gate field-effect transistor (IGFET). The nitride semiconductor IGFET is analogous in construction with the FIG. 1 LED except for a main semiconductor region $4_c$ in lieu of the main semiconductor region 4. The main semiconductor region $4_c$ of the IGFET includes a drain subregion 13 of the same n-GaN composition as the n-type nitride semiconductor layer 13 of the main semiconductor region 4 in FIG. 1. The drain subregion 13 has a p-type nitride semiconductor body subregion 41 formed therein by introduction of a p-type impurity, and this body subregion 41 has an n-type nitride semiconductor source subregion 42 formed therein by introduction of an n-type impurity. A gate electrode 44 is formed via an electrically insulating film 43 on the exposed surface of the body subregion 41. A source electrode 45 is joined directly to the source subregion 42. The electrode 6 under the p-type silicon substrate 1 serves as the drain electrode. It is apparent that a less voltage drop occurs between source 45 and drain 6 in this FET, too.

Possible Modifications

Notwithstanding the foregoing detailed disclosure it is not desired that the present invention be limited by the exact showings of the drawings or the description thereof. The following is a brief list of possible modifications, alterations or adaptations of the illustrated embodiments of the invention which are all believed to fall within the purview of the claims annexed hereto:

1. The multilayered buffer subregion 20 of the FIG. 4 embodiment may be incorporated in the LEDs of FIGS. 6 and 7, transistor of FIG. 8, and FET of FIG. 9.

2. The n-type nitride semiconductor layer 13 may be omitted from the embodiments of FIGS. 6-9, and the second buffer layer 12 may be used as the lower cladding of the active layer in the LEDs of FIGS. 6 and 7, the buffer region 3 as the collector in the transistor of FIG. 8, and the buffer region 3 as the drain in the FET of FIG. 9.

3. The division of the buffer region 3 or $3_a$ into two or more layers or sublayers as in the illustrated embodiments is not an absolute necessity; instead, it may take the form of a single layer of any of the nitrides that are generally expressed as:

$Al_xIn_yGa_{1-x-y}N$ where the subscript x is a numeral that is greater than zero and equal to or less than one; the subscript y is a numeral that is equal to or greater than zero and less than one; and the sum of x and y is greater than zero and less than one.

4. The second buffer layer 12 of the buffer region 3 or $3_a$ may not necessarily contain indium.

5. The alloy layer may be created by an independent step dedicated to that end, rather than as a result of the epitaxial growth of the buffer region 3 or $3_a$ and main semiconductor region 4, $4_a$, $4_b$ or $4_c$.

6. The invention is adaptable for pn-junction rectifier diodes, Schottky barrier diodes, or indeed any semiconductor devices in which current flows in the thickness direction of the substrate.

What is claimed is:

1. A nitride-based semiconductor device comprising:
   (a) a substrate of p-type silicon having sufficient conductivity to provide a current path, the substrate having a pair of opposite major surfaces;
   (b) an alloy layer disposed on one of the major surfaces of the substrate and containing at least gallium, aluminum and silicon;
   (c) a buffer region disposed on the alloy layer and having at least one buffer layer of an n-type nitride semiconductor:
   (d) a main semiconductor region disposed on the buffer region to provide a desired semiconductor device;
   (e) a first electrode formed on the main semiconductor region; and
   (f) a second electrode formed on the other major surface of the substrate.

2. A nitride-based semiconductor device as defined in claim 1, wherein the alloy layer is adapted to cause electrons and holes to be generated and recombined adjacent its interface with the p-type silicon substrate.

3. A nitride-based semiconductor device as defined in claim 1, wherein the alloy layer is made of an alloy of gallium, indium, aluminum and silicon.

4. A nitride-based semiconductor device as defined in claim 1, wherein the buffer region comprises:
   (a) a first buffer layer formed on the alloy layer and made from a nitride semiconductor containing aluminum; and
   (b) a second buffer layer formed on the first buffer layer and made from an n-type nitride semiconductor containing gallium.

5. A nitride-based semiconductor device as defined in claim 4, wherein the first buffer layer of the buffer region is made from any of nitrides that are generally expressed as:

$Al_xIn_{1-x-y}N$ where the subscript x is a numeral that is greater than zero and equal to or less than one; the subscript y is a numeral that are equal to or greater than zero and less than one; and the sum of x and y is greater than zero and equal to or less than one.

6. A nitride-based semiconductor device as defined in claim 5, wherein the first buffer layer of the buffer region is made from aluminum nitride, and wherein the first buffer layer of the buffer region is from about two to about 60 nanometers thick.

7. A nitride-based semiconductor device as defined in claim 5, wherein the second buffer layer of the buffer region is made from any of nitrides that are generally expressed as:

$Al_aIn_bGa_{1-a-b}N$ where the subscript a is a numeral that is equal to or greater than zero and less than one and, additionally, less than the subscript x in the formula above defining the nitrides for the first buffer layer of the buffer region; and the subscript b is a numeral that is equal to or greater than zero and less than one, plus an n-type impurity.

8. A nitride-based semiconductor device as defined in claim 7, wherein the second buffer layer of the buffer region is made from an n-type nitride semiconductor containing indium and gallium.

9. A nitride-based semiconductor device as defined in claim 4, wherein the buffer region further comprises a multilayered buffer subregion on the second buffer layer, the multilayered buffer subregion being an alternation of a plurality of first buffer sublayers and a plurality of second buffer sublayers, the first buffer sublayers being made from a nitride semiconductor containing a prescribed proportion of aluminum, the second buffer sublayers being made from a nitride semiconductor that either does not contain aluminum or does contain aluminum in a less proportion than do the first buffer sublayers.

10. A nitride-based semiconductor device as defined in claim 1, wherein the main semiconductor region comprises an active layer formed on the buffer region for generating light, and a p-type nitride semiconductor layer formed on the active layer, wherein the first electrode is an anode electrically connected to the p-type nitride semiconductor layer of the main semiconductor region, and wherein the second electrode is a cathode.

11. A nitride-based semiconductor device as defined in claim 10, wherein the first electrode comprises:
   (a) a transparent film of electrically conducting material on the p-type nitride semiconductor layer of the main semiconductor region; and
   (b) a metal-made bonding pad on the transparent film.

12. A nitride-based semiconductor device as defined in claim 11, wherein the bonding pad of the first electrode is made from a material such that a Schottky barrier is created between the bonding pad and the p-type nitride semiconductor layer of the main semiconductor region.

13. A nitride-based semiconductor device as defined in claim 11, further comprising an additional n-type nitride semiconductor layer interposed between the p-type nitride semiconductor layer of the main semiconductor region and the transparent film of the first electrode.

14. A nitride-based semiconductor device as defined in claim 1, wherein the main semiconductor region comprises a p-type base subregion and an n-type emitter subregion, wherein the first electrode is an emitter electrically connected to the emitter subregion, wherein the second electrode is a collector, and wherein the semiconductor device further comprises a base electrode electrically connected to the base subregion.

15. A nitride-based semiconductor device as defined in claim 1, wherein the main semiconductor region comprises a p-type body subregion and an n-type source subregion which are contiguous to each other, wherein the first electrode is a source electrically connected to the source subregion, wherein the second electrode is a drain, and wherein the semiconductor device further comprises a gate.

* * * * *